United States Patent
Suzuki

[19]

[11] Patent Number: 5,985,091
[45] Date of Patent: *Nov. 16, 1999

[54] MICROWAVE PLASMA PROCESSING APPARATUS AND MICROWAVE PLASMA PROCESSING METHOD

[75] Inventor: Nobumasa Suzuki, Yokohama, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/714,445

[22] Filed: Sep. 16, 1996

[30] Foreign Application Priority Data

Sep. 21, 1995 [JP] Japan ..................... 7-243375

[51] Int. Cl.⁶ ..................... H05H 1/00
[52] U.S. Cl. .................... 156/345; 118/723 MA; 118/723 MR; 204/298.37; 204/298.38; 216/70; 438/728; 427/571; 427/575
[58] Field of Search .............. 156/345; 118/723 MR, 118/723 MA; 204/298.37, 298.38, 298.16; 315/111.21; 216/70; 438/728; 427/571, 575

[56] References Cited

U.S. PATENT DOCUMENTS 4,776,918  10/1988  Otsubo et al. ..................... 156/345
5,133,826   7/1992  Dandl ............................. 156/345
5,183,531   2/1993  Terakado ....................... 156/345 X
5,370,765  12/1994  Dandl .
5,487,875   1/1996  Suzuki .......................... 422/186.05
5,517,085   5/1996  Engemann et al. ........... 118/723 MA X
5,538,699   7/1996  Suzuki .......................... 422/186.29
5,626,679   5/1997  Shimizu et al. ................ 118/723 MR

FOREIGN PATENT DOCUMENTS

626683A1  11/1994  European Pat. Off. .
5345982  12/1993  Japan .

Primary Examiner—Thi Dang
Attorney, Agent, or Firm—Fitzpatrick, Cella Harper & Scinto

[57] ABSTRACT

A microwave plasma processing apparatus comprises a plasma generation chamber, a processing chamber communicating with the plasma generation chamber, supporting of a substrate to be processed arranged in the processing chamber, a circular waveguide with slots arranged around the plasma generation chamber, and a magnetic field generation unit for generating a cusp magnetic field in the plasma generation chamber. A microwave plasma processing method using this apparatus is provided, to maintain a high-density and large-area uniform plasma, even at a low temperature, and even in a low-pressure region having a pressure of 1 mTorr.

10 Claims, 4 Drawing Sheets

MICROWAVE PLASMA PROCESSING APPARATUS AND MICROWAVE PLASMA PROCESSING METHOD

BACKGROUND OF THE INVENTION

1. Field of the Invention

The present invention relates to a microwave plasma processing apparatus and method capable of maintaining a high-density and large-area uniform plasma even in a low-pressure region.

2. Related Background Art

As a plasma processing apparatus using a microwave as an excitation source for producing a plasma, a CVD apparatus, an etching apparatus, or the like is known.

For example, film formation using such a so-called microwave plasma CVD apparatus is performed in the following manner. More specifically, a gas is supplied into a plasma generation chamber and a film formation chamber in the microwave plasma CVD apparatus, and, at the same time, microwave energy is applied to the microwave plasma CVD apparatus to generate a plasma in the plasma generation chamber, thereby exciting and resolving the gas. In this manner, a deposition film is formed on a substrate arranged in the film formation chamber.

An etching or ashing process, using a so-called microwave plasma etching apparatus, for a substrate to be processed is performed as follows. More specifically, a process gas is supplied into a processing chamber of the apparatus, and, at the same time, microwave energy is applied to the apparatus to excite and resolve the process gas, thereby generating a plasma in the processing chamber. In this manner, the surface of a substrate to be processed arranged in the processing chamber is subjected to etching or ashing.

In the microwave plasma processing apparatus, a microwave serving as a gas excitation source is used. For this reason, electrons can be accelerated by an electric field having a high frequency, and gas molecules can be efficiently ionized and excited. Therefore, the microwave plasma processing apparatus has the following advantages. First, gas ionization efficiency, gas excitation efficiency, and gas resolution efficiency are high, a plasma having a high density can be reliably and easily formed, and a high-quality process can be rapidly performed at a low temperature. In addition, since a microwave transmits through a dielectric, a plasma processing apparatus can be constituted as an electrodeless discharge type apparatus. For this reason, plasma processing having high cleanness can be advantageously performed.

In order to further increase the speed of such a microwave plasma processing apparatus, a plasma processing apparatus using electron cyclotron resonance (ECR) has been actually used. ECR is the following phenomenon. When a magnetic flux density is 87.5 mT, an electron cyclotron frequency at which electrons are rotated around a magnetic flux line is equal to the general frequency of a microwave, i.e., 2.45 GHz, the electrons resonantly absorb the microwave and are accelerated, thereby generating a high-density plasma. In the ECR plasma processing apparatus as described above, as an arrangement between a microwave feeding means and a magnetic field generation means, four typical arrangements are known.

More specifically, the following arrangements are used. (i) A microwave transmitted through a waveguide is fed into a cylindrical plasma generation chamber through a transparent window from a surface opposing a substrate to be processed, and a divergent magnetic field having the same axis as that of the central axis of the plasma generation chamber is fed through a single electromagnetic coil arranged around the plasma generation chamber (NTT scheme). (ii) A microwave transmitted through a waveguide is fed into a bell-like plasma generation chamber from a surface opposing a substrate to be processed, and a magnetic field having the same axis as that of the central axis of the plasma generation chamber is fed through a single electromagnetic coil arranged around the plasma generation chamber (HITACHI scheme). (iii) A microwave is fed into a plasma generation chamber through a Lisitano coil, which is a kind of a cylindrical slot antenna, and a magnetic field having the same axis as that of the central axis of the plasma generation chamber is fed through an electromagnetic coil arranged around the plasma generation chamber (Lisitano scheme). (iv) A microwave transmitted through a waveguide is fed into a cylindrical plasma generation chamber through a planar slot antenna from a surface opposing a substrate to be processed, and a loop-like magnetic field parallel to an antenna plane is fed through a permanent magnet arranged on the rear surface of the planar antenna (planar slot antenna scheme).

Figure 5A:
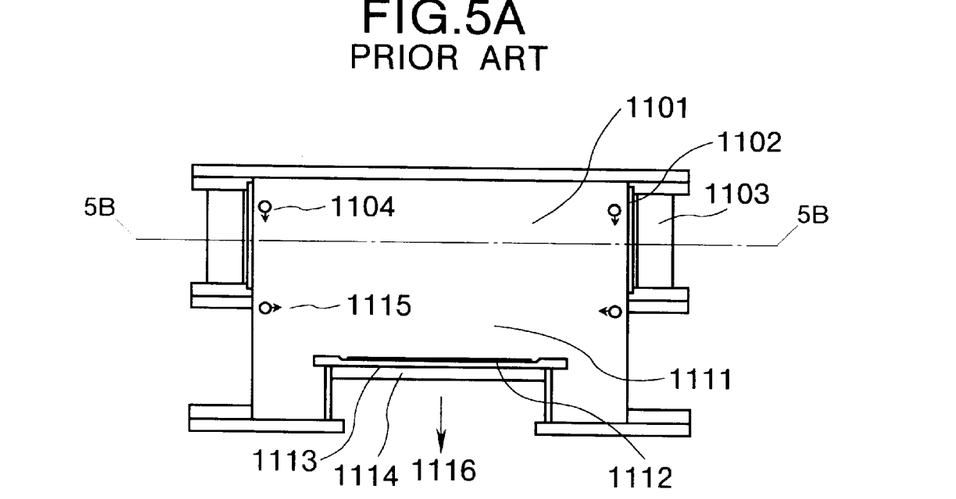
FIGS. 5A and 5B are views showing a microwave plasma processing apparatus as an example of the prior art.
Figure 5B:
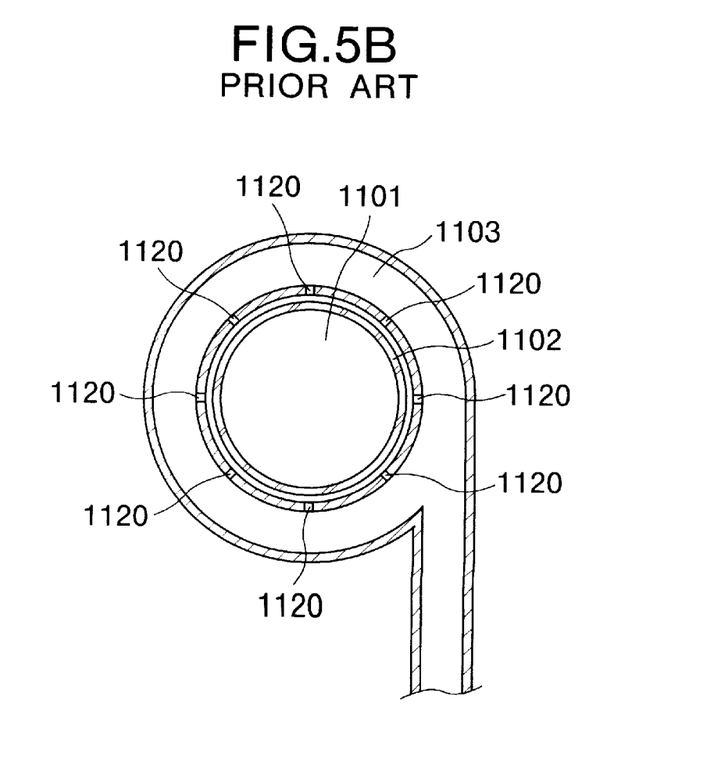

However, even in the above apparatus, a plasma density near the surface of the substrate to be processed is disadvantageously ununiform. On the other hand, in recent years, an apparatus using a circular waveguide having a plurality of slots formed in the inside surface of the circular waveguide has been proposed as an apparatus for uniformly and efficiently feeding a microwave (Japanese Patent Application No. 3-293010). This microwave plasma processing apparatus is shown in FIG. 5A. Reference numeral 1101 denotes a plasma generation chamber; 1102, a quartz tube constituting the plasma generation chamber 1101; 1103, a circular waveguide with slots for feeding a microwave into the plasma generation chamber 1101; 1104, a plasma generation gas supply means; 1111, a processing chamber communicating with the plasma generation chamber 1101; 1112, a substrate to be processed; 1113, a support member for the substrate 1112; 1114, a heater for heating the substrate 1112; 1115, a process gas supply means; and 1116, an exhaust. FIG. 5B is a sectional view showing the processing apparatus along a line 5B—5B in FIG. 5A. Reference numeral 1120 denotes slots. Plasma generation and plasma processing are performed as follows. The plasma generation chamber 1101 and the processing chamber 1111 are evacuated through an exhaust system (not shown). A plasma generation gas is supplied into the plasma generation chamber 1101 at a predetermined flow rate through the gas supply port 1104. A conductance valve (not shown) arranged in the exhaust system (not shown) is adjusted to hold the plasma generation chamber 1101 at a predetermined pressure. A desired power is supplied from a microwave power supply (not shown) into the plasma generation chamber 1101 through the circular waveguide 1103. Electrons are accelerated by the microwave electric field to produce a high-density plasma in the plasma generation chamber 1101. At this time, when a process gas is supplied into the processing chamber 1111 through the process gas supply means 1115, the process gas is excited by the produced high-density plasma to process the surface of the substrate to be processed 1112 placed on the support member 1113. The process gas may be supplied into the plasma generation gas supply port 1104, depending on the application.

The plasma processing is desirably performed at a temperature which is lowered as much as possible. This is because a plastic substrate in an MCD or a plastic LCD must be prevented from being deformed or resolved. In addition, in a ULSI, diffusion of an impurity, hillocks of Al wiring, thermal distortion, and the like must be prevented.

When the microwave plasma processing apparatus as described above is used, a low-temperature and high-density uniform plasma having an electron temperature of 3 eV or less and an electron density of about $10^{12}/cm^2$ can be produced in a large-diameter space. A gas sufficiently reacts with the plasma, and the gas can be supplied to the substrate in an active state. For this reason, high-quality and high-speed processing can be performed at a low temperature.

However, when processing is to be performed at a low temperature by using the microwave plasma processing apparatus which a low-temperature and high-density plasma is produced as shown in FIGS. 5A and 5B, there are the following points to be improved. More specifically, in plasma CVD, when a pressure is set to be 1 mTorr or less, the mean free path of precursor atoms increases, and the precursor atoms reach the substrate with sufficient energy. For this reason, film quality is desirably improved. However, electron density decreases in a region having a pressure of 1 mTorr or less, and unstable discharge is unsatisfactorily performed, which is unsatisfactory.

It is a main object of the present invention to provide a microwave plasma processing apparatus and a microwave plasma processing method in which nonunuiformity of a plasma near a substrate surface is canceled, and a high-density and large-area uniform plasma can be maintained even at a low temperature and even in a low-pressure region having a pressure of 1 mTorr or less.

SUMMARY OF THE INVENTION

A microwave plasma processing apparatus according to the present invention comprises a plasma generation chamber, a processing chamber communicating with the plasma generation chamber, means for supporting a substrate to be processed arranged in the processing chamber, a circular waveguide with slots arranged around the plasma generation chamber, and magnetic field generation means for generating a cusp magnetic field in the plasma generation chamber.

The magnetic field generation means includes electromagnetic coils or permanent magnets vertically arranged through the circular waveguide.

A microwave plasma processing method according to the present invention which uses the above apparatus comprises: the step of placing the substrate to be processed on the substrate support member; the step of evacuating the plasma generation chamber and the processing chamber; the step of supplying a gas into the plasma generation chamber and the processing chamber to hold the plasma generation chamber and the processing chamber at a predetermined pressure; and the step of feeding microwaves into the plasma generation chamber and generating a cups magnetic field to produce a plasma, thereby processing the substrate.

The microwave plasma processing method of the present invention can be used in a CVD, an oxidizing process, a nitriding process, doping, cleaning, etching, or ashing.

DETAILED DESCRIPTION OF THE PREFERRED EMBODIMENTS

The present invention will be described below in detail with reference to the accompanying drawings.

Apparatus

Figure 1A:
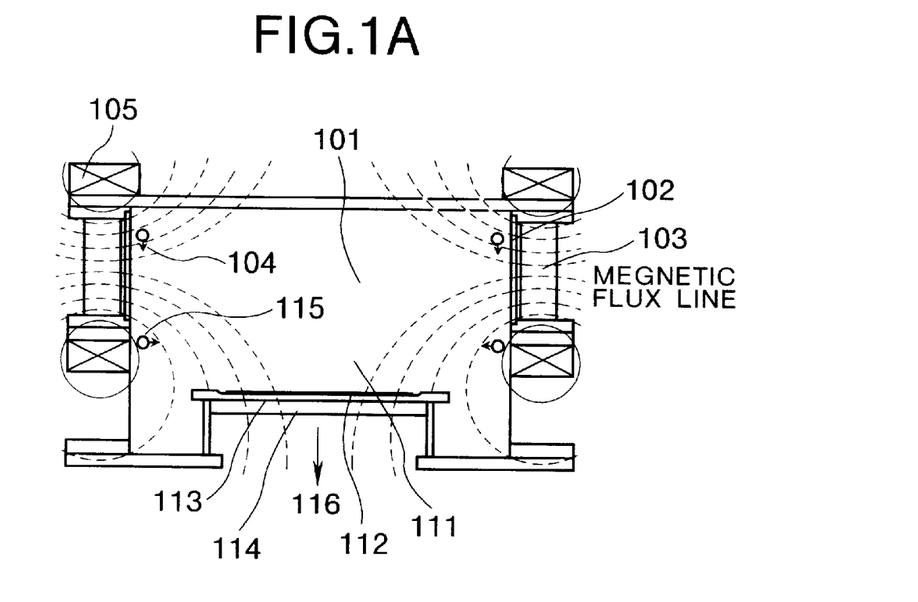
FIGS. 1A and 1B are views showing a microwave plasma processing apparatus as an example of the present invention.
Figure 1B:
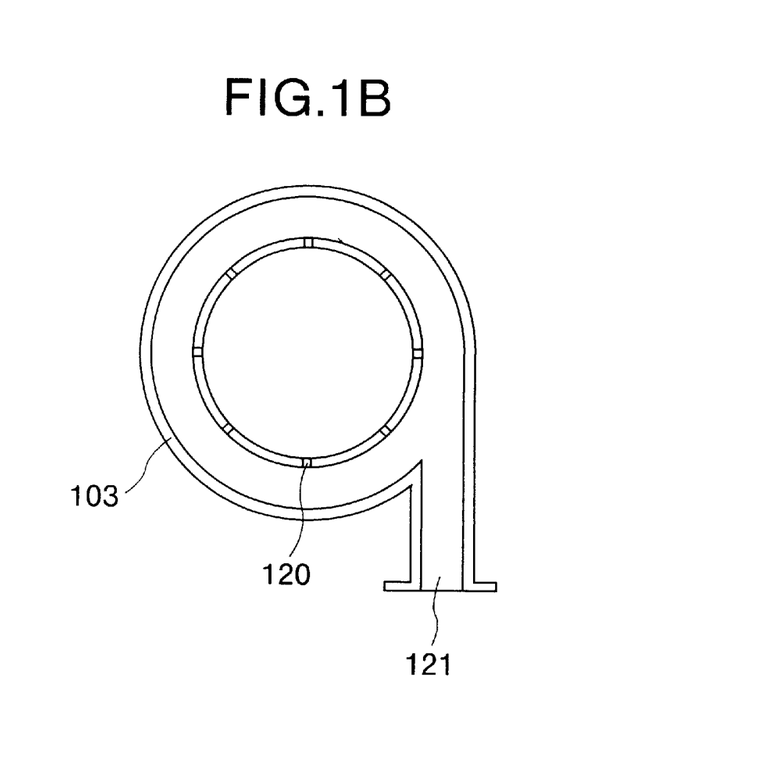

Side and upper views of a microwave plasma processing apparatus according to the present invention are shown in FIGS. 1A and 1B. Reference numeral 101 denotes a plasma generation chamber 101; 102, a quartz tube for constituting the plasma generation chamber 101; 103, a circular waveguide with slots for feeding a microwave into the plasma generation chamber 101; 104, a plasma generation gas supply means; 105, a magnetic field generation means for generating a cups magnetic field having a nodal surface on a plane including the center of the plurality of slots of the circular waveguide 103 and having a magnetic flux line almost perpendicular to the substrate support means, in which the magnetic flux density of a magnetic field near the slots is higher than the magnetic flux density of a magnetic field near the substrate; 111, a processing chamber communicating with the plasma generation chamber; 112, a substrate to be processed; 113, a support member for the substrate 112; 114, a heater for heating the substrate 112; 115, a process gas supply means; and 116, an exhaust. Reference numeral 120 denotes a slot arranged inside the circular waveguide with slots 103; 121, a portion for feeding a microwave into the circular waveguide 103.

Processing Method

Plasma generation and plasma processing are performed as follows. The plasma generation chamber 101 and the processing chamber 111 are evacuated through an exhaust system (not shown). A plasma generation gas is supplied into the plasma generation chamber 101 at a predetermined flow rate through the gas supply port 104. A conductance valve (not shown) arranged in the exhaust system (not shown) is adjusted to hold the plasma generation chamber 101 and the processing chamber 111 at a predetermined pressure. A cusp magnetic field is generated in the plasma generation chamber 101 by the magnetic field generation means 105, and a desired power is supplied from a microwave power supply (not shown) into the plasma generation chamber 101 through the circular waveguide 103, thereby producing a plasma in the plasma generation chamber 101. At this time, when a process gas is supplied into the processing chamber 111 through the process gas supply means 115, the process gas is excited by the produced high-density plasma to form a film on the surface of the substrate to be processed 112 placed on the support member 113. In such case, the process gas may be supplied into the plasma generation gas supply port 104 depending on the application.

Effect of Magnetic Field of the Invention

The apparatus according to the present invention has a cusp magnetic field generated in the plasma generation chamber. The cusp magnetic field is generated between two coils having different polarities when the coils oppose each other. The magnetic flux lines are shown in FIG. 1A. Electrons are diffused along the magnetic flux lines on a long path extending from the portion near the slots to the portion near the substrate while rotating around the magnetic flux lines, and loss caused by diffusion and recombination of the electrons can be suppressed. For this reason, a high-density and large-area uniform plasma can be maintained even at a low temperature and even in a low-pressure region having a pressure of 1 mTorr or less.

The magnetic field preferably has a nodal surface on a plane including the center of the plurality of slots of the circular waveguide with slots. The nodal surface on the plane including the center of the plurality of slots of the circular waveguide with slots is a surface on which the magnetic flux lines of the cups magnetic field are not traversed.

When the magnetic flux lines of the magnetic field are set to be almost perpendicular to the substrate, electrons or process gas is irradiated perpendicularly to the substrate. For this reason, precision can be improved in case of etching.

Magnetic Field Generation Means

As a magnetic field generation means used in the microwave plasma processing apparatus of the present invention, cylindrical coils having the same polarity are vertically arranged through the circular waveguide. With this arrangement, magnetic flux lines which are almost perpendicular to the substrate support means and have a nodal surface on a plane including the center of the plurality of slots of the circular waveguide with slots are generated. Not only coils, but also permanent magnets can be used. When the coils are used, a cooling means such as a water-cooling means or an air-cooling means may be used to prevent over-heating.

Microwave Feeding Means

As a preferable microwave frequency used in the microwave plasma processing apparatus of the present invention, a frequency can be properly selected from the range of 0.8 GHz to 20 GHz.

The waveguide used in the microwave plasma processing apparatus of the present invention may have a cylindrical shape, a disk-like shape, a polygon-like shape, or the like, depending on the shape of the plasma generation chamber.

Light Irradiation

Ultraviolet rays may be irradiated on the substrate surface to further improve the quality of processing. As a light source, any light source for emitting light rays which are absorbed by the substrate to be processed or gas adhered to the substrate can be applied. An excimer laser, an excimer lamp, a rare gas resonance line lamp, a low-pressure mercury lamp, or the like is appropriately used.

Pressure

The pressure in the generation chamber or processing chamber in the microwave plasma processing method of the present invention is selected from the range of 0.05 mTorr to 1.0 mTorr. According to CVD in a low-pressure region, the quality of a deposition film is improved.

Deposition Film

In formation of a deposition film by the microwave plasma processing method of the present invention, various deposition films such as an insulating film consisting of $Si_3N_4$, $SiO_2$, $Ta_2O_5$, $TiO_2$, TiN, $Al_2O_3$, AlN, $MgF_2$, or the like, a semiconductor film consisting of a-Si, poly-Si, SiC, GaAs, or the like, and a metal film consisting of Al, W, Mo, Ti, Ta, or the like can be efficiently formed by properly selecting a gas to be used.

A substrate used in the microwave plasma processing method of the present invention may be a semiconductor substrate, a conductive substrate, or an electrically insulating substrate. According to the apparatus of the present invention, deposition can be performed at a low temperature. For this reason, a substrate consisting a plastic or the like which has low heat resistance can be used.

As the conductive substrate, a metal such as Fe, Ni, Cr, Al, Mo, Nb, Ta, V, Ti, Pt, Pb, or the like, or an alloy thereof, e.g., brass or stainless steel is available.

As the insulating substrate, a film sheet or the like consisting of $SiO_2$-based quartz, various glasses, an inorganic material such as $Si_3N_4$, NaCl, KCl, LiF, $CaF_2$, $BaF_2$, $Al_2O_3$, AlN, or Mgo, or an organic material such as polyethylene, polyester, polycarbonate, cellulose acetate, polypropylene, polyvinylidene chloride, polystyrene, polyamide, or polyimide is available.

As a thin film forming gas, a generally known gas can be used. A gas which is easily resolved by the effect of a plasma and can be singularly deposited is desirably supplied into the film formation chamber through the film formation gas supply means or the like in the film formation chamber. A gas which is not easily resolved by the effect of the plasma and cannot be easily deposited is desirably supplied into the plasma generation chamber through the plasma generation gas supply port in the plasma generation chamber.

As a material containing Si atoms and supplied through the film formation gas supply means when an Si-based semiconductor thin film consisting of a-Si, poly-Si, SiC, or the like is formed, a material which is in a gas state at an atmospheric temperature and an atmospheric pressure or a material which can be easily gasified is used. That is, inorganic silanes such as $SiH_4$ and $Si_2H_6$, organic silanes such as tetraethylsilane (TES), tetramethylsilane (TMS), and dimethylsilane (DMS), or halosilanes such as $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$, and $SiC_2F_2$ are used. As a plasma generation gas supplied through the plasma generation gas supply port in this case, $H_2$, He, Ne, Ar, Kr, Xe, or Rn can be used.

As a material containing Si atoms and supplied through the film formation gas supply means when an Si-compound-based thin film consisting of $Si_3N_4$, $SiO_2$, or the like is formed, a material which is in a gaseous state at atmospheric temperature and pressure or a material which can be easily gasified is used. That is, inorganic silanes such as $SiH_4$ and $Si_2H_6$, organic silanes such as tetraethoxysilane (TEOS), tetramethoxysilane (TMOS), and octamethyl cyclotetrasilane (OMCTS), or halosilanes such as $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$, and $SiCl_2F_2$ are used. As a material supplied through the plasma generation gas supply port in this case, $N_2$, $NH_3$, $N_2H_4$, hexamethyldisilane (HMDS), $O_2$, $O_3$, $H_2O$, NO, $N_2O$, or $NO_2$ can be used.

As a material containing metal atoms and supplied through the film formation gas supply means when a metal thin film consisting of Al, W, Mo, Ti, Ta, or the like is formed, an inorganic metal such as trimethylaluminum (TMAl), triethylaluminum (TEAl), triisobutylaluminum (TIBAl), dimethylaluminum hydride (DMAlH), tungsten carbonyl ($W(CO)_6$), molybdenum carbonyl ($Mo(CO)_6$), trimethylgallium (TMGa), or triethylgallium (TEGa), a metal halide such as $AlCl_3$, $WF_6$, $TiCl_3$, or $TaCl_5$ can be used. As a plasma generation gas supplied through the plasma generation gas supply port in this case, $H_2$, He, Ne, Ar, Kr, Xe, or Rn can be used.

As a material containing metal atoms and supplied through the film formation gas supply means when a metal compound thin film consisting of $Al_2O_3$, AlN, $Ta_2O_5$, $TiO_2$, TiN, $WO_3$, or the like is formed, an inorganic metal such as trimethylaluminum (TMAl), triethylaluminum (TEAl), triisobutylaluminum (TIBAl), dimethylaluminum hydride (DMAlH), tungsten carbonyl ($W(CO)_6$), molybdenum carbonyl ($Mo(CO)_6$), trimethylgallium (TMGa), or triethylgallium (TEGa) can be used. A metal halide such as $AlCl_3$, $WF_6$, $TiCl_3$, or $TaCl_5$ can be used. As a plasma generation gas supplied through the plasma generation gas supply port in this case, $O_2$, $O_3$, $H_2O$, NO, $N_2O$, $NO_2$, $N_2$, $NH_3$, $N_2H_4$, hexamethyldisilane (HMDS), or the like can be used.

Plasma Processing

The microwave plasma processing apparatus of the present invention can also be applied to surface modification. When a gas to be used is properly selected, Si, Al, Ti, Zn, Ta, or the like is used as a substrate or a surface layer, and an oxidizing process, a nitriding process, or a process of doping B, As, P, or the like can be performed. In addition, a film formation technique employed in the present invention can also be applied to a cleaning method. In this case, the film formation technique can be applied to cleaning for an oxide, an inorganic material, or a heavy metal. The film formation technique can also be properly used for ashing.

As an oxidizing gas supplied through the plasma generation gas supply port when the substrate is subjected to an oxidizing surface process, $O_2$, $O_3$, $H_2O$, NO, $N_2O$, $NO_2$, or the like can be used. As a nitriding gas supplied through the plasma generation gas supply means when the substrate is subjected to a nitriding surface process, $N_2$, $NH_3$, $N_2H_4$, hexamethyldisilane (HMDS), or the like can be used. In this case, since film formation is not performed, a process gas is not supplied through the process gas supply means, or the same gas as the gas supplied through the plasma generation gas supply port is supplied.

As a cleaning gas supplied from the plasma generation gas supply port when the inorganic matter is cleaned from the substrate surface, $O_2$, $O_3$, $H_2O$, NO, $N_2O$, $NO_2$, or the like can be used. As a cleaning gas supplied from the plasma generation gas supply port when the organic matter is cleaned from the substrate surface, $F_2$, $CF_4$, $CH_2F_2$, $C_2F_6$, $CF_2Cl_2$, $SF_6$, $NF_3$, or the like can be used. In this case, since film formation is not performed, a source gas is not supplied through the film formation gas supply means, or the same gas as the gas supplied through the plasma generation gas supply port is supplied.

EXAMPLES

A microwave plasma processing apparatus and a processing method according to the present invention will be described below in detail with reference to the following apparatus examples. However, the present invention is not limited to these examples.

Apparatus Example 1

The apparatus shown in FIGS. 1A and 1B was manufactured in the following manner. The circular waveguide 103 has an internal wall section having a size of 27 mm×96 mm equal to that of a waveguide according to WRT-2 standards, and has a central diameter of 354 mm. The material of the circular waveguide 103 is stainless steel to keep the mechanical strength of the circular waveguide 103. Two-layered plating is performed on the inner wall surface of the circular waveguide 103 in such a manner that silver is coated on a copper plate to suppress propagation loss of microwaves. In the circular waveguide 103, slots for feeding microwaves into the plasma generation chamber 101 are formed. Each slot has a rectangular shape having a size of 42 mm (length)×2 mm (width), and the slots are formed at intervals each of which is ¼ of the guide wave length. The guide wave length depends on the frequency of the microwaves and the size of the section of the waveguide. When microwaves having a frequency of 2.45 GHz and a waveguide having the above size are used, the guide wave length is about 159 mm. In the circular waveguide 103 used in this case, 28 slots are formed at about 40 mm intervals.

A 4E tuner, a directional coupler, an isolator, and a microwave power supply (not shown) having a frequency of 2.45 GHz are sequentially connected to the circular waveguide 103.

Plasma generation and plasma processing are performed as follows. The plasma generation chamber 101 and the processing chamber 111 are evacuated through an exhaust system (not shown). A plasma generation gas is supplied into the plasma generation chamber 101 at a predetermined flow rate through the gas supply port 104. A conductance valve (not shown) arranged in the exhaust system (not shown) is adjusted to hold the plasma generation chamber 101 and the processing chamber 111 at a predetermined pressure. A desired magnetic field is generated in the plasma generation chamber 101 through the magnetic field generation means 105, and a desired power is supplied from microwave power supply (not shown) through the circular waveguide 103, thereby producing a plasma in the plasma generation chamber 101. At this time, when a process gas is supplied into the processing chamber 111 through the process gas supply means 115, the process gas is excited by the produced high-density plasma to process the surface of the substrate to be processed 112 placed on the support member 113. The process gas may be supplied into the plasma generation gas supply port 104 depending on the application.

By using the microwave plasma processing apparatus shown in FIGS. 1A and 1B, a plasma was produced under the conditions: an Ar flow rate of 500 sccm; a pressure of 1 mTorr; a microwave power of 3.0 kW, and a maximum magnetic flux density of 90 mT. The produced plasma was measured by a single probe method in the following manner. A voltage applied to the probe was changed within the range of −50 to +50 V, and a current flowing in the probe was measured by an I–V meter. An electron density, an electron temperature, and a plasma potential were calculated on the basis of the I–V curve obtained by Langmiuir's method. As a result, the electron density was $2.7 \times 10^{12}/cm^3$ (in $\phi 200$ plane), and the electron temperature was 3.6 eV. It was confirmed that a high-density plasma was formed although the pressure was set to be low.

Apparatus Example 2

Figure 2:
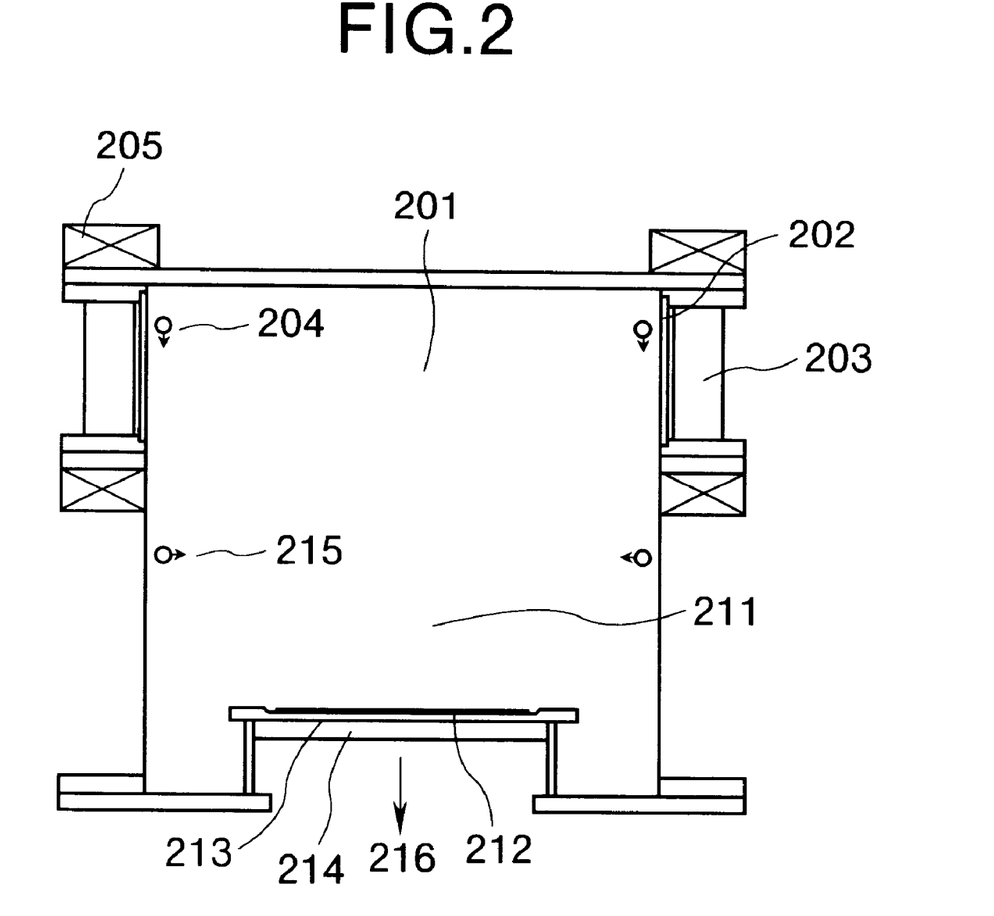
FIG. 2 is a view showing a microwave isolation plasma processing apparatus as an example of the present invention.

An isolation plasma processing apparatus which is an example of the present invention is shown in FIG. 2. Reference numeral 201 denotes a plasma generation chamber 201; 202, a quartz tube for constituting the plasma generation chamber 201; 203, a circular waveguide with slots for feeding a microwave into the plasma generation chamber 201; 204, a plasma generation gas supply means; 205, a magnetic field generation means; 211, a processing chamber communicating with the plasma generation chamber; 212, a substrate to be processed; 213, a support member for the substrate 212; 214, a heater for heating the substrate 212; 215, a process gas supply means; and 216, an exhaust. Apparatus Example 2 is different from Apparatus Example 1 in that the plasma-substrate interval in Apparatus Example 2 is larger than that in Apparatus Example 1 by 100 mm.

Plasma generation and plasma processing are performed as follows. The plasma generation chamber 201 and the processing chamber 211 are evacuated through an exhaust system (not shown). A plasma generation gas is supplied into the plasma generation chamber 201 at a predetermined flow rate through the gas supply port 204. A conductance valve (not shown) arranged in the exhaust system (not shown) is adjusted to hold the plasma generation chamber 201 at a predetermined pressure. A desired power level of power supplied from a DC power supply (not shown) to the coil 205 to generate a magnetic field in the plasma generation chamber 201, and desired power is supplied from a microwave power supply (not shown) into the plasma generation chamber 201 through the circular waveguide 203. Electrons spirally moving around magnetic flux lines generated in the plasma generation chamber 201 by the magnetic field generation means 205 resonantly absorb the microwave and are accelerated, thereby generating a higher-density plasma in the plasma generation chamber 201. At this time, when a process gas is supplied into the processing chamber 211 through the process gas supply means 215, the process gas reacts with the plasma generation gas excited by the produced high-density plasma to process the surface of the substrate to be processed 212 placed on the support member 213. In such case, the process gas may be supplied into the plasma generation gas supply port 204 depending on the application.

Apparatus Example 3

Figure 3:
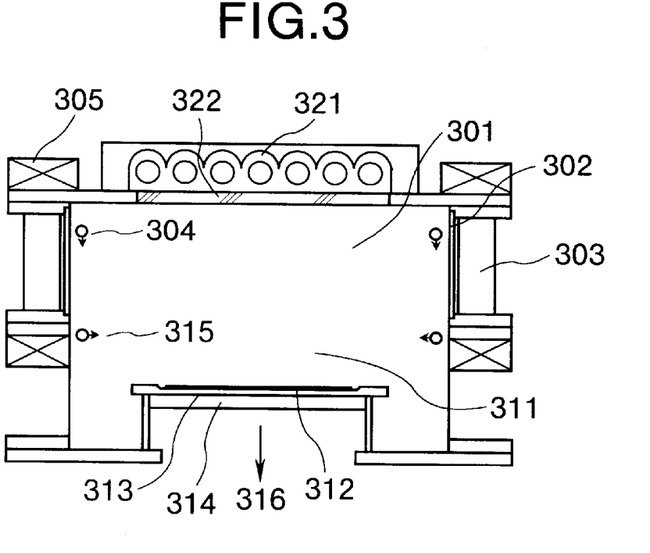
FIG. 3 is a view showing a photo-assist microwave plasma processing apparatus as an example of the present invention.

A photo-assistant processing apparatus which is an example of the present invention is shown in FIG. 3. Reference numeral 301 denotes a plasma generation chamber 301; 302, a quartz tube for constituting the plasma generation chamber 301; 303, a circular waveguide with slots for feeding a microwave into the plasma generation chamber 301; 304, a plasma generation gas supply means; 305, a magnetic field generation means; 311, a processing chamber communicating with the plasma generation chamber; 312, a substrate to be processed; 313, a support member for the substrate 312; 314, a heater for heating the substrate 312; 315, a process gas supply means; 316, an exhaust; 321, a lighting system for irradiating ultraviolet rays onto the surface of the substrate 312; and 322, a light guide window for guiding ultraviolet rays from the lighting system 321 to the processing chamber 311 through the plasma generation chamber 301.

Plasma generation and plasma processing are performed as follows. The plasma generation chamber 301 and the processing chamber 311 are evacuated through an exhaust system (not shown). Ultraviolet rays from the lighting system 321 are irradiated onto the surface of the substrate 312 through the light guide window 322, and the substrate 312 is held at a desired temperature. A plasma generation gas is supplied into the plasma generation chamber 301 at a predetermined flow rate through the gas supply port 304. A conductance valve (not shown) arranged in the exhaust system (not shown) is adjusted to hold the plasma generation chamber 301 at a predetermined pressure. A magnetic field is generated in the plasma generation chamber 301 through the magnetic field generation means 305, and desired power is supplied from a microwave power supply (not shown) through the circular waveguide 303, thereby producing a plasma in the plasma generation chamber 301. At this time, when a process gas is supplied into the processing chamber 311 through the process gas supply means 315, the process gas is excited by the produced high-density plasma to process the surface of the substrate to be processed 312 placed on the support member 313. At this time, since the surface of the substrate 312 is activated by the ultraviolet rays, high-quality processing can be performed. In this case, the process gas may be supplied into the plasma generation gas supply port 304 depending on the application.

As the light source of the lighting system 321, any light source having a wavelength absorbed by the substrate surface or the gas or a precursor adhered to the substrate surface can be used. That is, a low-pressure mercury lamp, a xenon-mercury lamp, a heavy hydrogen lamp, an Ar resonance line lamp, a Kr resonance line lamp, a Xe resonance line lamp, an excimer lamp, an excimer laser, an $Ar^+$ laser harmonic wave, an $N_2$ laser, or a YAG laser harmonic wave can be used.

Apparatus Example 4

Figure 4:
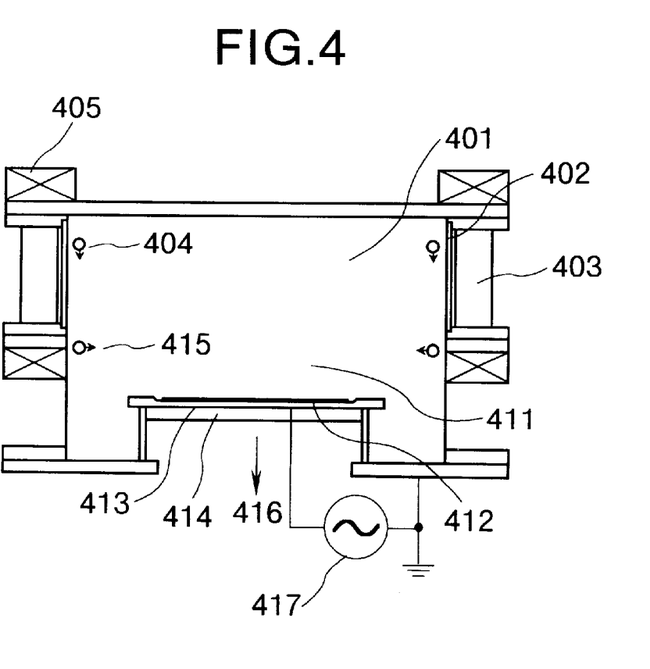
FIG. 4 is a view showing a bias microwave plasma processing apparatus as an example of the present invention.

A bias plasma processing apparatus which is an example of the present invention is shown in FIG. 4. Reference numeral 401 denotes a plasma generation chamber 401; 402, a quartz tube for constituting the plasma generation chamber 401; 403, a circular waveguide with slots for feeding microwaves into the plasma generation chamber 401; 404, a plasma generation gas supply means; 405, a magnetic field generation means; 411, a plasma generation chamber communicating with the plasma generation chamber; 412, a substrate to be processed; 413, a support member for the substrate 412; 414, a heater for heating the substrate 412; 415, a process gas supply means; 416, an exhaust; and 417, a high-frequency supply means for applying a bias to the substrate support member 412.

Plasma generation and plasma processing are performed as follows. The plasma generation chamber 401 and the processing chamber 411 are evacuated through an exhaust system (not shown). The substrate 412 is heated to a desired temperature through the heater 414, and held at the desired temperature. A plasma generation gas is supplied into the plasma generation chamber 401 at a predetermined flow rate through the gas supply port 404. A conductance valve (not shown) arranged in the exhaust system (not shown) is adjusted to hold the plasma generation chamber 401 at a predetermined pressure. A magnetic field is generated in the plasma generation chamber 401 through the magnetic field generation means 405, and desired power is supplied from a microwave power supply (not shown) through the circular waveguide 403, thereby producing a plasma in the plasma generation chamber 401.

In addition, a high-frequency wave is applied to the substrate support member 413 through the high-frequency supply means 417 to generate a self-bias on the substrate surface. At this time, when a process gas is supplied into the processing chamber 411 through the process gas supply means 415, the process gas is excited by the produced high-density plasma to accelerate generated ions by the self-bias, thereby processing the surface of the substrate to be processed 412 placed on the support member 413. In this case, the process gas may be supplied into the plasma generation gas supply port 404 depending on the application.

The frequency of the high-frequency supply means 417 is optimally set to be 100 kHz to 20 MHz, more optimally, 1 MHz to 5 MHz in consideration of discharge stability and the self-bias.

A microwave plasma CVD method according to the present invention will be described in detail with reference to processing method examples of the present invention. The present invention is not limited to these examples.

Processing Method Example 1

A silicon nitride film for an optomagnetic disk was formed by using the microwave plasma processing apparatus shown in FIGS. 1A and 1B.

As the substrate 112, a polycarbonate (PC) substrate (φ3.5 inches) with a 1.2 μm width group was used. The PC substrate 112 was placed on the substrate support member 113, and the plasma generation chamber 101 and the film formation chamber 111 were evacuated through an exhaust system (not shown) to reduce the pressure in the plasma generation chamber 101 and the film formation chamber 111 to $10^{-6}$ Torr. Nitrogen gas was supplied at a flow rate of 100 sccm through the plasma generation gas supply port 104, and argon gas was supplied into the plasma generation chamber 101 at a flow rate of 600 sccm. At the same time, monosilane gas was supplied into the film formation chamber 111 at a flow rate of 200 sccm through the film formation gas supply means 115. A conductance valve (not shown) arranged in the exhaust system (not shown) was adjusted to hold the pressure in the film formation chamber 111 at 5 mTorr. A magnetic field having a maximum magnetic flux density of 90 mT was generated in the plasma generation chamber 101 through the magnetic field generation means 105, and 3.0-kW power was supplied from a 2.45-GHz microwave power supply through the circular waveguide 103. In this manner, a plasma was produced in the plasma generation chamber 101. In this case, the nitrogen gas supplied through the plasma generation gas supply means 104 was excited and resolved in the plasma generation chamber 101 to be active seeds, and the active seeds were transported toward the silicon substrate 112 to react with the monosilane gas supplied through the film formation gas supply means 115, thereby forming a silicon nitride film having a thickness of 100 nm on the silicon substrate 112 within 12 seconds. Upon completion of film formation, film quality such as a refractive index was evaluated.

It was confirmed that the film formation rate of the obtained silicon nitride film was very high, i.e., 500 nm/min, and that a high-quality film having a refractive index of 2.2, good adhesion, and good durability could be obtained. The density of the film was 2.9 g/cm$^3$. Therefore, the film having a density higher than that (2.7 g/cm$^3$) of a film formed without supplying a magnetic field was formed.

Processing Method Example 2

A silicon oxide film for preventing plastic lens reflection and a silicon nitride film were formed by using the microwave plasma processing apparatus shown in FIGS. 1A and 1B.

As the substrate 112, a plastic convex lens having a diameter of 50 mm was used. The PC substrate 112 was placed on the substrate support member 113, and the plasma generation chamber 101 and the film formation 111 were evacuated through an exhaust system (not shown) to reduce the pressure in the plasma generation chamber 101 and the film formation 111 to $10^{-6}$ Torr. Nitrogen gas was supplied at a flow rate of 150 sccm through the plasma generation gas supply means 104. At the same time, monosilane gas was supplied into the film formation chamber 111 at a flow rate of 100 sccm through the film formation gas supply means 115. A conductance valve (not shown) arranged in the exhaust system (not shown) was adjusted to hold the pressure in the film formation chamber 111 at 1 mTorr. Power was supplied from a DC power supply (not shown) to a coil 106 to generate a magnetic field having a maximum magnetic flux density of 90 mT in the plasma generation chamber 101, and 3.0-kW power was supplied from a 2.45-GHz microwave power supply (not shown) into the plasma generation chamber 101 through the circular waveguide 103. In this manner, a plasma was produced in the plasma generation chamber 101. In this case, the nitrogen gas supplied through the plasma generation gas supply means 104 was excited and resolved in the plasma generation chamber 101 to be active seeds such as nitrogen atoms, and the active seeds were transported toward the lens 112 to react with the monosilane gas supplied through the film formation gas supply means 115, thereby forming a silicon nitride film having a thickness of 21 nm on the lens 112.

An oxygen gas was supplied at a flow rate of 200 sccm into the plasma generation chamber 101 through the plasma generation gas supply means 104. At the same time, monosilane gas was supplied into the film formation chamber 111 at a flow rate of 100 sccm through the film formation gas supply means 115. A conductance valve (not shown) arranged in the exhaust system (not shown) was adjusted to hold the pressure in the film formation chamber 111 at 1 mTorr. Power was supplied from a DC power supply (not shown) to a coil 106 to generate a magnetic field having a maximum magnetic flux density of 90 mT in the plasma generation chamber 101, and 2.0-kW power was supplied from a 2.45-GHz microwave power supply (not shown) into the plasma generation chamber 101 through the circular waveguide 103. In this manner, a plasma was produced in the plasma generation chamber 101. In this case, the oxygen gas supplied through the plasma generation gas supply means 104 was excited and resolved in the plasma generation chamber 101 to be active seeds such as oxygen atoms, and the active seeds were transported toward the glass substrate 112 to react with the monosilane gas supplied through the film formation gas supply means 115, thereby forming a silicon oxide film having a thickness of 86 nm on the glass substrate 112. Upon completion of film formation, a film formation rate and reflection characteristics were evaluated.

It was confirmed that the formation rates of the silicon nitride film and the silicon oxide film were very high, i.e., 300 nm/min and 360 nm/min, respectively, and that extremely preferable optical characteristics could be obtained, e.g., a reflectance at about 500 nm was 0.3%.

Processing Method Example 3

A silicon nitride film for protecting a semiconductor element was formed by using the microwave plasma processing apparatus shown in FIGS. 1A and 1B.

As the substrate 112, a p-type monocrystalline silicon substrate (plane orientation <100>, resistivity: 10 Ωcm) with an interlayer SiO$_2$ film on which an Al wiring pattern (line and space: 0.5 μm) was formed was used. After the substrate 112 was placed on the substrate support member 113, the plasma generation chamber 101 and the film formation chamber 111 were evacuated through an exhaust system (not shown) to reduce the pressure in the plasma generation chamber 101 and the film formation 111 to $10^{-6}$ Torr. A heater (not shown) was turned on to heat the substrate 112 to 300° C., and the substrate was held at this temperature. Nitrogen gas was supplied at a flow rate 500 sccm into the plasma generation chamber 101 through the plasma generation gas supply port 104. At the same time, monosilane gas was supplied into the film formation chamber 111 at a flow rate of 100 sccm through the film formation gas supply means 115. A conductance valve (not shown) arranged in the exhaust system (not shown) was adjusted to hold the pressure in the film formation chamber 111 at 5 mTorr. Power was supplied from a DC power supply (not shown) to a coil 106 to generate a magnetic field having a maximum magnetic flux density of 90 mT in the plasma generation chamber 101, and 3.0-kW power was supplied from a 2.45-GHz microwave power supply (not shown) through the circular waveguide 103. In this manner, a plasma was produced in the plasma generation chamber 101. In this case, the nitrogen gas supplied through a plasma generation gas supply means 108 was excited and resolved in the plasma generation chamber 101 to be active seeds, and the active seeds were transported toward the silicon substrate 112 to react with the monosilane gas supplied through the film formation gas supply means 115, thereby forming a silicon nitride film having a thickness of 1.0 μm on the silicon substrate 112. Upon completion of film formation, the film formation rate and a film quality, stress, were evaluated. The stress was calculated such that an amount of warpage of the substrate after and before film formation was measured by a laser interferometer Zygo (trade name).

It was confirmed that the formation rate of the silicon nitride film was very high, i.e., 460 nm/min, and that an extremely high-quality film having a stress of $1.1 \times 10^9$ dyn/cm$^2$ (compression), a leakage current of $1.2 \times 10^{-10}$ A/cm$^2$, and a breakdown voltage of 9 MV/cm could be obtained.

Processing Method Example 4

A BPSG film for a semiconductor element was etched by using the microwave plasma processing apparatus shown in FIGS. 1A and 1B.

As the substrate 112, a p-type monocrystalline silicon substrate (plane orientation <100>, resistivity: 10 Ωcm) on which a BPSG film having a thickness of 1 μm was formed on a polysilicon pattern (line and space: 0.5 μm) was used. After the silicon substrate 112 was placed on the substrate support member 113, the plasma generation chamber 101 and the film formation chamber 111 were evacuated through an exhaust system (not shown) to reduce the pressure in the plasma generation chamber 101 and the film formation 111 to $10^{-6}$ Torr. $CF_4$ gas was supplied at a flow rate of 300 sccm into the plasma generation chamber 101 through the plasma generation gas supply means 104. A conductance valve (not shown) arranged in the exhaust system (not shown) was adjusted to hold the pressure in the film formation chamber 111 at 0.5 mTorr. Power was supplied from a DC power supply (not shown) to a coil 106 to generate a magnetic field having a maximum magnetic flux density of 90 mT in the plasma generation chamber 101, and 1.5-kW power was supplied from a 2.45-GHz microwave power supply through the circular waveguide 103. In this manner, a plasma was produced in the plasma generation chamber 101. In this case, the $CF_4$ gas supplied through a plasma generation gas supply means 104 was excited and resolved in the plasma generation chamber 101 to be active seeds, and the active seeds were transported toward the silicon substrate 112 to etch the BPSG film. After etching, a selectivity ratio of etching rates and an etching shape were evaluated. The etching shape was evaluated such that the section of an etched silicon oxide film was observed with a scanning electron microscope (SEM).

It was confirmed that the etching rate and the selectivity ratio of the etching rate of the BPSG film to the etching rate of a polysilicon film were preferable, i.e., 300 nm/min and 30, respectively, that the etching shape was almost perpendicular, and that microloading effect was small.

Processing Method Example 5

A silicon oxide film for insulating a semiconductor element gate was formed by using the isolation plasma processing apparatus shown in FIG. 2.

As the substrate 212, a p-type monocrystalline silicon substrate (plane orientation <100>, resistivity: 10 Ωcm) was used. After the silicon substrate 212 was placed on the substrate support member 213, the plasma generation chamber 201 and the film formation chamber 211 were evacuated through an exhaust system (not shown) to reduce the pressure in the plasma generation chamber 201 and the film formation 211 to $10^{-6}$ Torr. A heater (not shown) was turned on to heat the silicon substrate 212 to 300° C., and the substrate 212 was held at this temperature. Oxygen gas was supplied at a flow rate of 200 sccm into the plasma generation chamber 201 through the plasma generation gas supply means 204. At the same time, monosilane gas was supplied into the film formation chamber 211 at a flow rate of 50 sccm through the film formation gas supply means 215. A conductance valve (not shown) arranged in the exhaust system (not shown) was adjusted to hold the pressure in the film formation chamber 211 at 20 mTorr. Power was supplied from a DC power supply (not shown) to a coil 206 to generate a magnetic field having a maximum magnetic flux density of 90 mT in the plasma generation chamber 201, and 1.5-kW power was supplied from a 2.45-GHz microwave power supply into the plasma generation chamber 201 through the circular waveguide 203. In this manner, a plasma was produced in the plasma generation chamber 201. In this case, the oxygen gas supplied through the plasma generation gas supply means 204 was excited and resolved in the plasma generation chamber 201 to be active seeds such as oxygen atoms, and the active seeds were transported toward the silicon substrate 212 to react with the monosilane gas supplied through the film formation gas supply means 215, thereby forming a silicon oxide film having a thickness of 0.1 μm on the silicon substrate 212. Upon completion of film formation, a film formation rate, uniformity, a leakage current, a breakdown voltage, and an interfacial level density were evaluated. The interfacial level density was calculated on the basis of a C–V curve obtained when a high-frequency wave of 1 MHz obtained by a capacity measuring device was applied.

It was confirmed that the film formation rate and uniformity of the silicon oxide film were preferable, i.e., 110 nm/min±2.3% and that an extremely high-quality film having a leakage current of $4 \times 10^{-11}$ A/cm$^2$, a breakdown voltage of 11 MV/cm, and an interfacial level density of $6 \times 10^{10}$ cm$^{-2}$ could be obtained.

Processing Method Example 6

A silicon oxide film for insulating semiconductor element layers from each other was formed by using a photo-assistant microwave plasma processing apparatus shown in FIG. 3.

As the substrate 312, a p-type monocrystalline silicon substrate (plane orientation <100>, resistivity: 10 Ωcm) on which an Al pattern (line and space: 0.5 μm) was formed on the uppermost portion was used. After the silicon substrate 312 was placed on the substrate support member 313, the plasma generation chamber 301 and the film formation chamber 311 were evacuated through an exhaust system (not shown) to reduce the pressure in the plasma generation chamber 301 and the film formation 311 to $10^{-6}$ Torr. A KrCl* excimer lamp of the lighting system 321 was turned on to irradiate light onto the surface of the silicon substrate 312 such that an illuminance on the surface was set to be 20 mW/cm$^2$. A heater (not shown) was turned on to heat the silicon substrate 312 to 300° C., and the substrate 312 was held at this temperature. Oxygen gas was supplied at a flow rate of 500 sccm into the plasma generation chamber 311 through the plasma generation gas supply means 304. At the same time, a tetraethoxysilane (TEOS) gas was supplied into the film formation chamber 311 at a flow rate of 200 sccm from the film formation gas supply means 315 into the film formation chamber 311. A conductance valve (not shown)

arranged in the exhaust system (not shown) was adjusted to hold the pressure in the plasma generation chamber 301 at 0.1 mTorr and to hold the pressure in the film formation chamber 311 at 0.5 Torr. Power was supplied from a DC power supply (not shown) to a coil 306 to generate a magnetic field having a maximum magnetic flux density of 90 mT in the plasma generation chamber 301, and 1.5-kW power was supplied from a 2.45-GHz microwave power supply into the plasma generation chamber 301 through the circular waveguide 303. In this manner, a plasma was produced in the plasma generation chamber 301. In this case, the oxygen gas supplied through the plasma generation gas supply means 304 was excited and resolved in the plasma generation chamber 301 to be active seeds, and the active seeds were transported toward the silicon substrate 312 to react with the tetraethoxysilane gas supplied through the film formation gas supply means 315, thereby forming a silicon oxide film having a thickness of 0.8 $\mu$m on the silicon substrate 312. Upon completion of film formation, a film formation rate, uniformity, a breakdown voltage, and step coverage were evaluated. The step coverage was evaluated such that the section of the silicon oxide film formed on the Al wiring pattern was observed by a scanning electron microscope (SEM) to calculate a ratio (cover factor) of a film thickness on a side wall of the step to a film thickness on the step.

It was confirmed that the film formation rate and uniformity of the silicon oxide film were preferable, i.e., 180 nm/min±2.7% and that an extremely high-quality film having a breakdown voltage of 9.3 MV/cm and a cover factor of 0.9 could be obtained.

Processing Method Example 7

A polysilicon film between semiconductor element gate electrodes was etched by using the bias plasma processing apparatus shown in FIG. 4.

As the substrate 412, a p-type monocrystalline silicon substrate (plane orientation <100>, resistivity: 10 Ωcm) on which a polysilicon film was formed on the uppermost portion was used. After the silicon substrate 412 was placed on the substrate support member 413, the plasma generation chamber 401 and the etching chamber 411 were evacuated through an exhaust system (not shown) to reduce the pressure in the plasma generation chamber 401 and the etching chamber 411 to $10^{-6}$ Torr. $CF_4$ gas and oxygen gas were supplied at flow rates of 300 scam and 20 scam into the plasma generation chamber 411 through the plasma generation gas supply means 404, respectively. A conductance valve (not shown) arranged in the exhaust system (not shown) was adjusted to hold the pressure in the plasma generation chamber 401 at 0.5 mTorr. Power was supplied from a DC power supply (not shown) to a coil 406 to generate a magnetic field having a maximum magnetic flux density of 90 mT in the plasma generation chamber 401, and 5-kW power was supplied from a 2.45-GHz microwave power supply into the plasma generation chamber 401 through the circular waveguide 403. In this manner, a plasma was produced in the plasma generation chamber 401. In this case, the $CF_4$ gas and oxygen gas supplied through a plasma generation gas supply means 404 were excited and resolved in the plasma generation chamber 401 to be active seeds, and the active seeds were transported toward the silicon substrate 412 to etch the polysilicon film by ions accelerated by a self-bias. After etching, an etching rate, a selectivity ratio, and an etching shape were evaluated. The etching shape was evaluated such that the section of the etched polysilicon film was observed with a scanning electron microscope (SEM).

It was confirmed that the etching rate and the selectivity ratio of the etching rate of the polysilicon film to the etching rate of an $SiO_2$ film were preferable, i.e., 600 nm/min and 30, respectively, that the perpendicularity of the etching shape was higher than that of an etching shape obtained without applying a high-frequency wave, and that the microloading effect was small.

What is claimed is:

1. A microwave plasma processing apparatus comprising a plasma generation chamber having a cylindrical inner side wall that is without unevenness, a processing chamber communicating with said plasma generation chamber, means for supporting a substrate to be processed arranged in said processing chamber, an endless circular waveguide with slots arranged around said plasma generation chamber, and magnetic field generation means arranged outside said plasma generation chamber for generating a cusp magnetic field in said plasma generation chamber, wherein said magnetic field generation means comprises electromagnet coils or permanent magnets, wherein the cusp magnetic field has a node on a plane including the center of the slots of said circular waveguide with slots, wherein a magnetic flux density near the substrate to be processed is lower than a magnetic flux density near the slots, wherein the magnetic flux line of the magnetic field is substantially perpendicular near the surface of the substrate to be processed, and wherein a first supply port for supplying a plasma generation gas is provided in said plasma generation chamber such that the plasma generation gas is ejected in the direction intersection the magnetic flux line, and a second supply port for supplying a process gas is provided in said processing chamber such that the process gas is ejected in the direction intersecting the magnetic flux line, the first supply port and the second supply port being provided separately and individually.

2. A microwave plasma processing apparatus according to claim 1, wherein a ratio of a magnetic field near the slots to the microwave frequency is about $3.57 \times 10^{-11}$ T/Hz.

3. A microwave plasma processing apparatus comprising a plasma generation chamber having a cylindrical inner side wall that is without unevenness, a processing chamber communicating with said plasma generation chamber, means for supporting a substrate to be processed arranged in said processing chamber, an endless circular waveguide with slots arranged around said plasma generation chamber, and magnetic field generation means arranged outside said plasma generation chamber for generating a cusp magnetic field in said plasma generation chamber, wherein said magnetic field generation means comprises electromagnet coils or permanent magnets, wherein the cusp magnetic field has a node on a plane including the center of the slots of said circular waveguide with slots, wherein a magnetic flux density near the substrate to be processed is lower than a magnetic flux density near the slots, wherein the magnetic flux line of the magnetic field is substantially perpendicular near the surface of the substrate to be processed, and wherein said plasma generation chamber is located at a position spaced from said substrate support means.

4. A microwave plasma processing apparatus comprising a plasma generation chamber having a cylindrical inner side wall that is without unevenness, a processing chamber communicating with said plasma generation chamber, means for supporting a substrate to be processed arranged in said processing chamber, an endless circular waveguide with slots arranged around said plasma generation chamber, magnetic field generation means arranged outside said plasma generation chamber for generating a cusp magnetic field in said plasma generation chamber, and mean for irradiating ultraviolet rays onto the surface of the substrate to be processed, wherein said magnetic field generation means comprises electromagnet coils or permanent magnets, wherein the cusp magnetic field has a node on a plane including the center of the slots of said circular waveguide with slots, wherein a magnetic flux density near the substrate to be processed is lower than a magnetic flux density near the slots, and wherein the magnetic flux line of the magnetic field is substantially perpendicular near the surface of the substrate to be processed.

5. A microwave plasma processing apparatus according to claim 1, further comprising means for applying a high-frequency bias to said substrate support means.

6. A microwave plasma processing method which uses a microwave plasma processing apparatus comprising a plasma generation chamber having a cylindrical inner side wall that is without unevenness, a process chamber communication with the plasma generation chamber, means for supporting a substrate to be processed arranged in the processing chamber, an endless circular waveguide with slots arranged around the plasma generation chamber, the magnetic field generation means arranged outside the plasma generation chamber for generating a cusp magnetic field in the plasma generation chamber, wherein the magnetic field generation means comprises electromagnet coils or permanent magnets, said method comprising:

the step of placing the substrate to be processed on the means for supporting the substrate;

the step of evacuating the plasma generation chamber and the processing chamber;

the step of supplying a gas into the plasma generation chamber and the processing chamber to hold the plasma generation chamber and the processing chamber at a predetermined pressure, said supplying step also includes supplying a plasma generation gas into the plasma generation chamber from a first supply port such that the plasma generation gas is elected in the direction intersecting the magnetic flux line and supplying a process gas into the processing chamber from a second supply port which is different from the first supply port such that the process gas is elected into the direction intersecting the magnetic flux line;

the step of feeding microwaves into the plasma generation chamber and generating a cusp magnetic field to produce a plasma, thereby processing the substrate to be processed, wherein the cusp magnetic field has a node on a plane including the center of the slots of the circular waveguide with slots, wherein a magnetic flux density near the substrate to be processed is lower than a magnetic flux density near the slots, and wherein the magnetic flux line of the magnetic field is substantially perpendicular near the surface of the substrate to be processed.

7. A microwave plasma processing method according to claim 6, wherein the process is CVD, an oxidizing process, a nitriding process, doping, cleaning, etching, or ashing.

8. A microwave plasma processing method which uses a microwave plasma processing apparatus comprising a plasma generation chamber having a cylindrical inner side wall that is without unevenness, a process chamber communication with the plasma generation chamber, means for supporting a substrate o be processed arranged in the processing chamber, an endless circular waveguide with slots arranged around the plasma generation chamber, the magnetic field generation means arranged outside the plasma generation chamber for generating a cusp magnetic field in the plasma generation chamber, wherein the magnetic field generation means comprises electromagnet coils or permanent magnets, said method comprising:

the step of placing the substrate to be processed on the means for supporting the substrate;

the step of evacuating the plasma generation chamber and the processing chamber;

the step of supplying a gas into the plasma generation chamber and the processing chamber to hold the plasma generation chamber and the processing chamber at a predetermined pressure;

the step of feeding microwaves into the plasma generation chamber and generating a cusp magnetic field to produce a plasma, thereby processing the substrate to be processed, wherein the cusp magnetic field has a node on a plane including the center of the slots of the circular waveguide with slots, wherein a magnetic flux density near the substrate to be processed is lower than a magnetic flux density near the slots, wherein the magnetic flux line of the magnetic field is substantially perpendicular near the surface of the substrate to be processed, and wherein the step of processing the substrate to be processed includes the step of irradiating ultraviolet rays.

9. A microwave plasma processing method according to claim 6, wherein the substrate to be processed is a plastic substrate.

10. A microwave plasma processing method according to claim 6, wherein the predetermined pressure is 1 mTorr or less.

* * * * *

UNITED STATES PATENT AND TRADEMARK OFFICE
CERTIFICATE OF CORRECTION

PATENT NO.   :   5,985,091

DATED        :   November 16, 1999

INVENTOR(S)  :   NOBUMASA SUZUKI

Page 1 of 3

It is certified that error appears in the above-identified patent and that said Letters Patent is hereby corrected as shown below:

ON THE TITLE PAGE [56] References Cited:

FOREIGN PATENT DOCUMENTS, "5345982" should read --5-345982--.

ON THE TITLE PAGE:

Attorney, Agent, or Firm, "Fitzpatrick, Cella Harper & Scinto" should read --Fitzpatrick, Cella, Harper & Scinto--.

ON THE TITLE PAGE [57] ABSTRACT:

Line 3, "of" should be deleted.

SHEET 2:

FIG. 1A., "MEGNETIC" should read --MAGNETIC--.

COLUMN 2:

Line 25, "ununiform" should read --nonuniform--.

COLUMN 3:

Line 13, "which" should read --in which--;
    Line 26, "nonununiformity" should read --nonuniformity--; and
    Line 54, "cups" should read --cusp--.

UNITED STATES PATENT AND TRADEMARK OFFICE
CERTIFICATE OF CORRECTION

PATENT NO. : 5,985,091

DATED : November 16, 1999

INVENTOR(S) : NOBUMASA SUZUKI

It is certified that error appears in the above-identified patent and that said Letters Patent is hereby corrected as shown below:

COLUMN 4:

Line 19, "cups" should read --cusp--.

COLUMN 5:

Line 7, "cups" should read --cusp--.
    Line 67, "steel" should read --steel,--

COLUMN 6:

Line 26, "$SiC_2F_2$" should read --$SiCl_2F_2$--.

COLUMN 8:

Line 34, "Langmiuir's" should read --Langmuir's--;
    Line 65, "power level" should read --level--; and
    Line 66, "supplied" should read --is supplied--.

COLUMN 10:

Line 50, "optimally" should read --preferably-- and "more" should be deleted.

COLUMN 15:

Line 45, "scam" (both occurrences) should read --sccm--.

COLUMN 16:

Line 33, "intersection" should read --intersecting--.

UNITED STATES PATENT AND TRADEMARK OFFICE
CERTIFICATE OF CORRECTION

PATENT NO. : 5,985,091

DATED : November 16, 1999

INVENTOR(S) : NOBUMASA SUZUKI

It is certified that error appears in the above-identified patent and that said Letters Patent is hereby corrected as shown below:

<u>COLUMN 17</u>:

Line 8, "mean" should read --means--.

Signed and Sealed this

Fifth Day of December, 2000

Attest:

*Attesting Officer*

Q. TODD DICKINSON

*Director of Patents and Trademarks*